United States Patent [19]

Goto

[11] 4,045,713
[45] Aug. 30, 1977

[54] AUTOMATIC SWEEP CIRCUIT

[75] Inventor: Tadaaki Goto, Tokyo, Japan

[73] Assignee: Trio Kabushiki Kaisha, Tokyo, Japan

[21] Appl. No.: 623,329

[22] Filed: Oct. 17, 1975

[30] Foreign Application Priority Data

Jan. 20, 1975  Japan ................................... 50-8463

[51] Int. Cl.² ...................... H01J 29/70; H01J 29/72
[52] U.S. Cl. ................................. 315/391; 315/364;
315/399; 307/228; 331/17
[58] Field of Search ............... 315/364, 402, 399, 391;
307/228; 328/185; 331/17

[56] References Cited

U.S. PATENT DOCUMENTS

| 2,663,800 | 12/1953 | Herzog | 307/228 |
| 3,754,194 | 8/1973 | Camp | 331/17 |

*Primary Examiner*—Maynard R. Wilbur
*Assistant Examiner*—T. M. Blum
*Attorney, Agent, or Firm*—Wenderoth, Lind & Ponack

[57] ABSTRACT

An input signal is converted into a dc voltage proportional to the frequency of the input signal in a frequency-voltage converter, while saw tooth waves are generated in a saw tooth wave generator triggered with the input signal. The dc voltage is applied to a variable resistance circuit where the resistance is changed corresponding to the dc voltage. The period of such saw tooth waves is controlled with the variable resistance circuit so that the saw tooth waves may follow the input signal frequency for automatically indicating at all times a desired number of waveforms on the screen of a cathode-ray tube. The variable resistance circuit may be controlled with means for free running operation of the saw tooth wave generator during the absence of the input signal.

2 Claims, 2 Drawing Figures

AUTOMATIC SWEEP CIRCUIT

BACKGROUND OF THE INVENTION

This invention relates to a sweep circuit used in oscilloscopes and the like, and more particularly to an automatic sweep circuit for indicating a specific number of waveforms constantly on the screen of a cathode-ray tube by automatically making a sweep frequency follow the frequency of an input signal which may vary with time.

Generally, in prior-art sweep generators a sweep frequency suitable for the frequency of any input signal must be selected by manually changing a sweep range as required. It is difficult to observe such waveforms moving on the screen when the input signal frequency varies. There are various types of automatic sweep circuits now in use, which are however unsatisfactory in linearity of saw tooth waves or complicated in circuit design, and which are expensive if the linearity is improved.

SUMMARY OF THE INVENTION

In view of the foregoing, it is an object of this invention to provide an automatic sweep which is relatively simple in circuit arrangement and inexpensive. It is another object of this invention to provide an automatic sweep circuit provided with means for free running a saw tooth wave generator during the absence of an input signal applied thereto.

According to the invention a sweep frequency or the period of saw tooth waves is controlled with means having a field effect transistor the resistance of which is changed with a dc voltage applied thereto and produced in proportion to the frequency of an input signal in a frequency-voltage converter, so that a specific number of waveforms can be indicated constantly on the screen of a cathode-ray tube without any manual adjustment.

The present invention will be more readily understood by reading the following description in conjunction with the accompanying drawings.

DESCRIPTION OF THE PREFERRED EMBODIMENT

Figure 1:
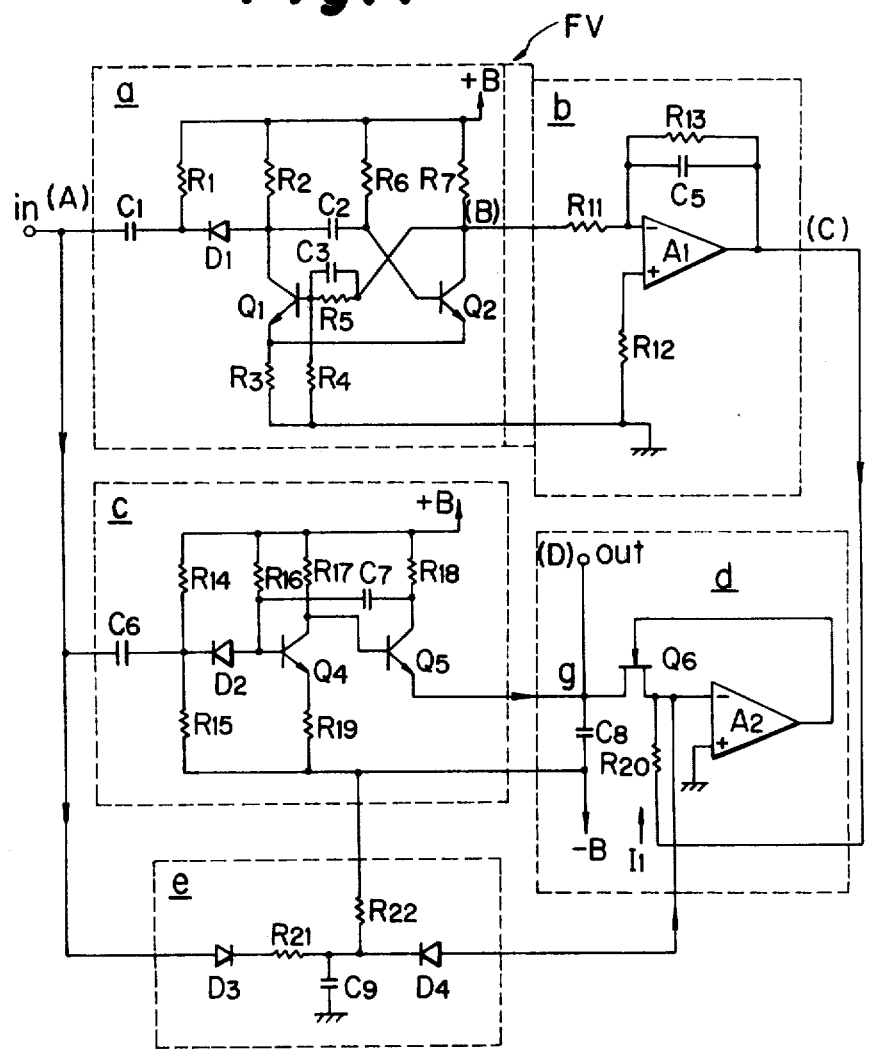
FIG. 1 is a circuit diagram showing a preferred embodiment of an automatic sweep circuit of the invention.
Figure 2:
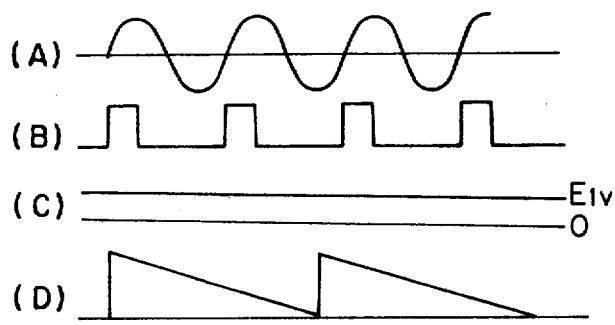
FIG. 2 is a time chart explanatory of the circuit operation.

In a circuit shown in FIG. 1, $a$ represents a one-shot multivibrator consisting of resistances $R_1$ to $R_7$, capacitors $C_1$ to $C_3$, transistors $Q_1$ and $Q_2$, and a diode $D_1$, which is commonly used for generating pulses B of a specific width with an input signal A applied to a terminal (in). $b$ represents an integrator, consisting of resistances $R_{11}$ to $R_{13}$, a capacitor $C_5$, and an operational amplifier $A_1$, which produces a dc voltage C proportional to the frequency of the input signal by integrating pulses B. $c$ represents a saw tooth wave generator, consisting of resistances $R_{14}$ to $R_{19}$, capacitors C6 and C7 transistors $Q_4$ and $Q_5$, and a diode $D_2$, which generates saw tooth waves when triggered with the input signal. The one-shot multivibrator $a$ and the integrator $b$ constitute a frequency voltage converter FV. The integrator $b$ may be formed of resistors and capacitors without using the operational amplifier. In FIG. 1, $d$ represents a variable resistance circuit, consisting of a resistance $R_{20}$, a capacitor $C_8$, a field effect transistor $Q_6$, and an operational amplifier $A_2$, where the dc voltage C from the frequency voltage converter FV is applied to the minus input terminal of the operational amplifier $A_2$ through the resistance $R_{20}$, amplifier $A_2$ having the plus input terminal thereof grounded. Thus, the minus input terminal may be kept constantly in imaginary short and at ground potential within a control range of the operational amplifier $A_2$ by controlling voltage at the gate of the transistor $Q_6$. The drain of the field effect transistor is connected to the minus input terminal, while the source is connected to the output of the saw tooth wave generator $c$. A reference letter $e$ represents a circuit, consisting of resistances $R_{21}$ and $R_{22}$, diodes $D_3$ and $D_4$, and a capacitor $C_9$, which makes the saw tooth wave generator $c$ free running by supplying a bias to the transistor $Q_6$ while no input signal A is fed to the terminal (in). In other words the circuit $e$ makes the variable resistance circuit $d$ inoperative for generation of saw tooth waves during the absence of the input signal.

With such arrangement as described above, the operation of the invention will be explained. When an input signal (A) is supplied to the terminal (in), the one-shot multivibrator $a$ triggered therewith may produce pulses B of a fixed width, which are then integrated in the integrator $b$ and are converted into a dc voltage (C) that is proportional to the frequency $f_1$ of the input signal A. On the other hand saw tooth waves D are generated in the saw tooth wave generator $c$ with the input signal (A) supplied thereto, and appear at a junction g of the capacitor $C_8$ for charge and discharge and the source of the transistor $Q_6$. The dc voltage (C) from the frequency voltage converter FV is applied to the resistance $R_{20}$ in the variable resistance circuit $d$, and a current flows therethrough, which is given by the formula $I_1 = E_{1v} / R_{20}$, where $E_{1v}$ is the magnitude of the dc voltage. This current also flows through the transistor $Q_6$, the resistance of which is therefore equivalent to $R_{Q_6} = E_{2v} / I_1$, where $E_{2v}$ is the voltage at the terminal g.

Now assuming an input frequency to be ten times $f_1$ or $10f_1$, a current $I_2$ is given by $10E_{1v} / R_{20} = 10I_1$. Hence the equivalent resistance of the transistor $Q_6$ is given by $R'_{Q_6} = E_{2v} / I_2 = E_{2v} / 10I_1 = 1/10 \times R_{Q_6}$. This shows that an increase in the input frequency by ten times results in a decrease in the equivalent resistance of the transistor $Q_6$ by a factor of 1/10. Likewise, an increase in the input frequency by 100 or 1000 times results in a decrease in the equivalent resistance of the same transistor by a factor of 1/100 or 1/1000. Assuming a period of certain saw tooth waves to be $T_1$, $T_1 = (1/C_8 \cdot R_{Q_6})$. Then, if the input frequency increases ten times, a period of such saw tooth waves is given by $$T_2 = \frac{1}{C_8 \cdot 1/10 \cdot R_{Q_6}} = 10T_1.$$

Similarly, if the input frequency increases 100 or 1000 times, a period of such saw tooth waves may increase 100 or 1000 times. In this manner a specific number of waveforms can be indicated at all times automatically on the screen of a cathode-ray tube.

The free running operation of the automatic sweep circuit as described above will now be explained. When the input signal (A) is not fed to the terminal (in), no dc voltage such as (C) is produced, and saw tooth waves cannot be generated as a result of an increase to almost infinity in the equivalent resistance of the transistor $Q_6$. To prevent this, the circuit $e$ consisting of diode $D_3$, resistance $R_{21}$, capacitor $C_9$, resistance $R_{22}$, and diode $D_4$ is provided in which a dc voltage is produced by rectifying and smoothing the input signal through diode $D_3$, resistance $R_{21}$, and capacitor $C_9$. To this dc voltage is added a negative bias -B through the resistance $R_{22}$, so that positive potential may be produced at a junction of the resistance $R_{21}$ and the capacitor $C_9$ during the presence of the input signal, while negative potential may be applied to a junction of the drain of the transistor $Q_6$ and the minus input of the operational amplifier $A_2$ through a diode $D_4$ during the absence of the input signal at the terminal (in). Thus the circuit $e$ does not effect the transistor $Q_6$ while the input signal is present. When the input signal is absent, the negative bias $-B$ is supplied to the transistor $Q_6$ through the resistance $R_{22}$ and consequently the equivalent resistance $R''_{Q_6}$ of the field effect transistor is given by $$R'' = E_{2\nu} \div (-B/R_{20})$$

which is constant. Then saw tooth waves may be generated at a period of $T = (1/C_8 \cdot R''_{Q_6})$ without any input signal being fed to the terminal (in). In this manner the variable resistance circuit $d$ is made inoperative for generation of saw tooth waves at the time of no input signal. The number of waveforms may be changed by varying the resistance $R_{20}$.

As has been described heretofore, the invention permits automatic indication at all times of a specific number of waveforms of an input signal without manual adjustment of sweep ranges, highly stable synchronization, and faster response when the input signal varies. Furthermore, linearity of sweep waves can be improved by feeding the output from the operational amplifier $A_2$ back to the gate of the transistor $Q_6$. The invention makes it easy and simple to observe frequency responses and waveforms and to compare amplitudes of a varying input signal.

Although a particular embodiment of this invention has been illustrated and described, it will be understood that such is not intended to limit the scope of the invention thereto, since many modifications may be made thereto. It is therefore contemplated by the appended claims to cover any such modifications as fall within the true spirit and scope of the invention.

What is claimed is:

1. An automatic sweep circuit comprising:
frequency voltage converter circuit means connected to a source to receive therefrom an input signal, to generate input pulses, and to convert said pulses to a d.c. voltage proportional to the frequency of said input signal;
saw tooth wave generator means connected to said source for generating saw tooth waves when triggered by said input signal; and
variable resistance circuit means, connected to said frequency voltage converter means and to said saw tooth wave generator means, for controlling said saw tooth wave generator means by controlling the period of said saw tooth waves such that said saw tooth waves automatically follow said frequency of said input signal, said variable resistance circuit means comprising an operational amplifier having an input connected to said frequency voltage converter circuit means to receive therefrom said d.c. voltage and an output, and a field effect transistor serially connected between the output of said saw tooth wave generator means and said input of said operational amplifier, said field effect transistor having a gate connected to said output of said operational amplifier, the gate voltage of said field effect transistor thereby being controlled by said output of said operational amplifier.

2. A circuit as claimed in claim 1, further comprising free-running circuit means, connected to said input of said operational amplifier, for rectifying said input signal and for applying a bias to said field effect transistor and said operational amplifier only during the absence of said input signal, and for thereby rendering said variable resistance circuit means inoperative and said saw tooth wave generator means operative during the absence of said input signal.

* * * * *